United States Patent [19]

Amano et al.

[11] Patent Number: 5,323,240
[45] Date of Patent: Jun. 21, 1994

[54] TELEVISION RECEIVER THAT AUTOMATICALLY KEEPS TRACK OF FAVORITE CHANNELS TO FACILITATE TUNING

[75] Inventors: Toshio Amano; Mitsumasa Saitoh, both of Kanagawa, Japan

[73] Assignee: Sony Corporation, Tokyo, Japan

[21] Appl. No.: 11,422

[22] Filed: Jan. 29, 1993

[30] Foreign Application Priority Data

Feb. 7, 1992 [JP] Japan ................. 4-056132

[51] Int. Cl.⁵ .............................................. H04N 5/50
[52] U.S. Cl. ...................................... 348/731; 358/84; 455/181.1; 455/186.1; 348/734; 348/1
[58] Field of Search ............... 358/191.1, 193.1, 194.1, 358/84; 455/186.1, 186.2, 185.1, 2, 181.1; H04N 5/50

[56] References Cited

U.S. PATENT DOCUMENTS

| | | | |
|---|---|---|---|
| 4,833,728 | 5/1989 | Kimura et al. | 455/186.1 |
| 4,873,584 | 10/1989 | Hashimoto | 358/191.1 |
| 4,914,517 | 4/1990 | Duffield | 358/194.1 |
| 5,075,771 | 12/1991 | Hashimoto | 455/2 |
| 5,081,680 | 1/1992 | Bennett | 358/84 |

FOREIGN PATENT DOCUMENTS 58-164385  9/1983  Japan ............... H04N 7/08

*Primary Examiner*—James J. Groody
*Assistant Examiner*—Jeffery S. Murrell
*Attorney, Agent, or Firm*—Lewis H. Eslinger; Jay H. Maioli

[57] ABSTRACT

A TV receiver has a tuner and a controller for controlling a tuning operation of the tuner. The controller includes a calculation unit for effecting a calculation of preferred stations using as parameters tuned channels and the times for which the channels are selected. A tuning frequency arrangement storing unit determines the channels that are frequently watched by a user on the basis of the calculation and stores indications of the channels. The channel indications thus stored are read out in ranked order to perform a tuning operation in response to successive actuation of a preferred-station key.

2 Claims, 5 Drawing Sheets

_5,323,240_

TELEVISION RECEIVER THAT AUTOMATICALLY KEEPS TRACK OF FAVORITE CHANNELS TO FACILITATE TUNING

BACKGROUND OF THE INVENTION

1. Field of the Invention

This invention relates to a television (TV) receiver, and particularly to a TV receiver in which information based on a user's life style can be obtained 2. Description of Conventional Technique A present TV receiver has been frequently used in such a manner that a channel selecting operation of selecting a desired one of many broadcasting channels such as VHF broadcasting stations. UHF broadcasting stations, BS broadcasts from a broadcasting satellite, etc. is carried out so as to be matched with a user's life style.

That is a viewer's favorite broadcast channels (channels which are more frequently used by a viewer) tend to be fixed according to time and circumstances in accordance with an individual life style. For example some viewers provide a high audience rating to an A station which frequently broadcasts baseball games of their favorite team when a professional baseball pennant race is started, and some viewers watch, without missing a single day, a sumo wrestling program of a B station which broadcasts the program everyday.

Here, the following situation is considered. After switching a TV receiver on, a viewer having such a life style watches a gardening program of another broadcasting station (i.e., a station which is not his favorite station), and a time for a sumo wrestling program which he watches everyday has come. If he does not beforehand preset a broadcast channel of the sumo wrestling program in the TV receiver or if a preset operation itself is impossible because the number of preset broadcast channels is already equal to the permissible number, he can not watch the sumo wrestling program unless a current channel is switched over through a position tuning, a direct tuning or a skip tuning operation.

In such a situation, if he searches a desired channel through a channel UP key or a channel DOWN key, the search operation is very cumbersome when the target channel is far from the current channel, and if he searches a desired channel through ten keys, the search operation is very inconvenient because the number of the target channel is unknown.

SUMMARY OF THE INVENTION

This invention is implemented to overcome the above problem, and a TV receiver of this invention is equipped in a controller thereof with a calculation unit for constantly calculating a tuning frequency of a broadcast channel using as a parameter a time for which the channel is selected, and tuning frequency arrangement storing means for arranging and setting channels in order from higher tuning frequency to lower tuning frequency, and further equipped with a "my station" or preferred-station key, that is, a Favorite-key (hereinafter referred to as "F key") so that a channel can be automatically switched over by pushing the F key in tuning-frequency order.

Since the broadcast channels which would be habitually frequently used by a viewer are arranged and stored in tuning frequency order into the memory in the controller, it is not necessary to preset a frequently-used channel, and the number of rankings in tuning frequency can be increased by increasing memory capacity, so that broadcast channels from first to tenth ranking of tuning frequency or more can be successively displayed and selected.

DETAILED DESCRIPTION OF PREFERRED EMBODIMENTS

A first embodiment of this invention will be described with reference to FIGS. 1 and 2.

Figure 1:
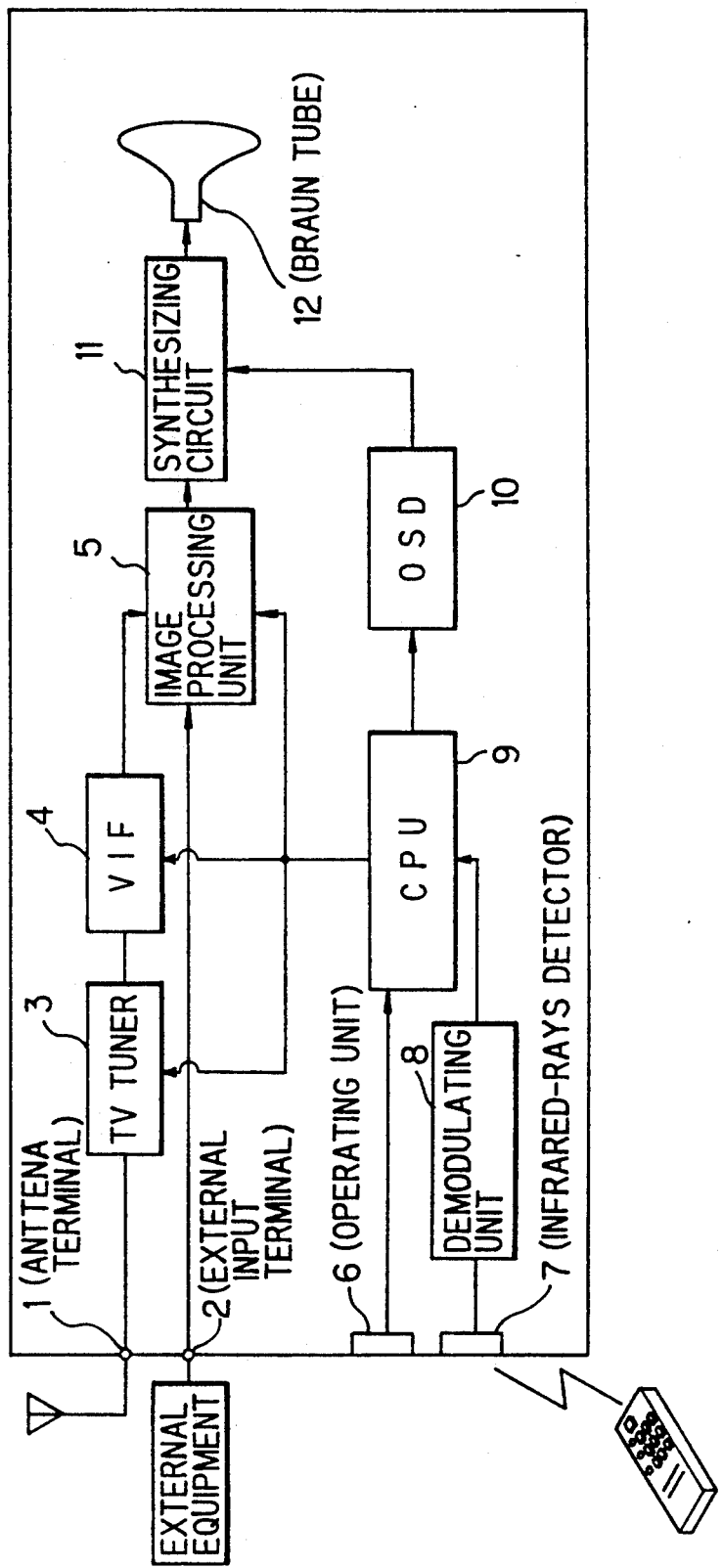
FIG. 1 is a block diagram showing an embodiment of this invention.

FIG. 1 is a block diagram showing an embodiment of a television receiver according to this invention. In FIG. 1, a reference numeral 1 represents an antenna terminal, a reference numeral 2 represents an external input terminal, a reference numeral 3 represents a TV tuner for selecting a received radio wave, a reference numeral 4 represents an intermediate frequency amplifier, a reference numeral 5 represents an image processing unit, a reference numeral 10 represents a character generator for outputting a character signal, a reference numeral 9 represents a controller for controlling the operation of each of the units as described above, and a reference numeral 6 represents an operating unit which is provided on a panel of the television receiver to enable a viewer to adjust a channel sound volume, etc. An F key is provided in the operation unit 6 or an operation button of a remote commander to select a program which is frequently watched by the viewer (hereinafter referred to as "viewer's favorite program"). A reference numeral 7 represents an infrared-rays detector which is provided in correspondence to the remote commander at the external side, a reference numeral 8 represents a demodulating unit, a reference numeral 11 represents a synthesizing circuit for synthesizing a video signal and a character signal, and a reference numeral 12 represents a Braun tube. A scanning circuit, an audio circuit, etc. are omitted.

Figure 2:
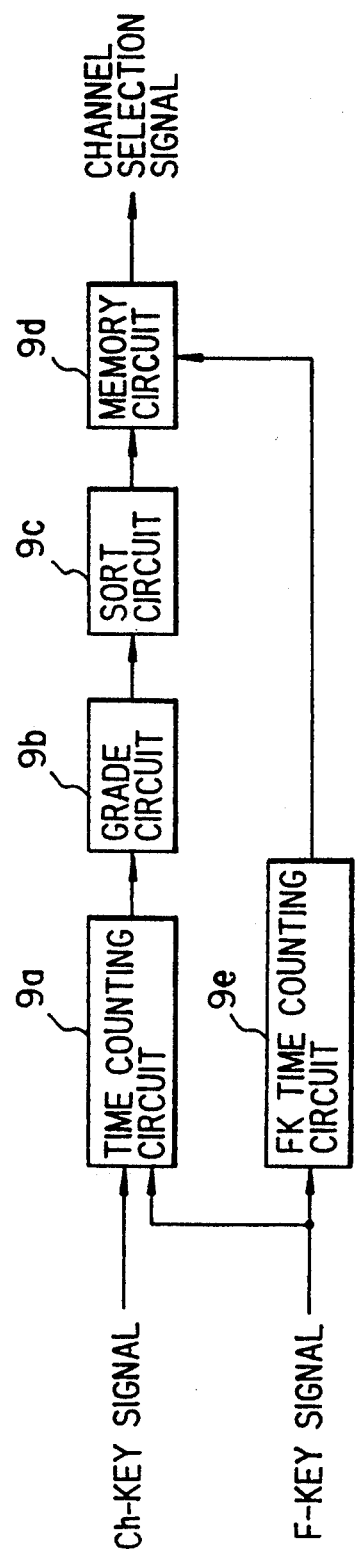
FIG. 2 is a block diagram showing a part of the controller 5 of FIG. 1.

FIG. 2 is a block diagram of functions related to the F key in the control unit 9 of the TV receiver according to this invention. In FIG. 2, a reference numeral 9a represents a time counting circuit for counting a time interval of the operation of the channel key, a reference numeral 9b represents a grade circuit for calculating the grade of a selected channel on the basis of the time counted by the time counting circuit 9a, a reference numeral 9c represents a sort circuit for sorting the channels ranked by the grade circuit 9b in ascending order, a reference numeral 9d represents a rank memory circuit for storing ranks sorted by the sort circuit 9c, and a reference numeral 9e represents an FK (F key) time counting circuit for counting a time interval of tile operation of the F key.

The TV receiver according to this invention is equipped with the circuit blocks as shown in FIGS. 1 and 2, so that like an ordinary TV receiver a power on/off operation, a selecting operation of a broadcasting station, sound volume adjustment can be also performed by, for example, a remote commander.

In the TV receiver according to this invention, the counting of a TV watching time is started from the time when a broadcasting station is tuned and a TV watching state for the broadcasting station is judged to start, tuning frequencies indicating total watching times of the respective broadcasting stations are collected, and then those channels which are frequently selected in everyday life are ranked on the basis of the collection data, so that the tuning operation of the broadcasting stations is successively carried out by a single F key.

Figure 3:
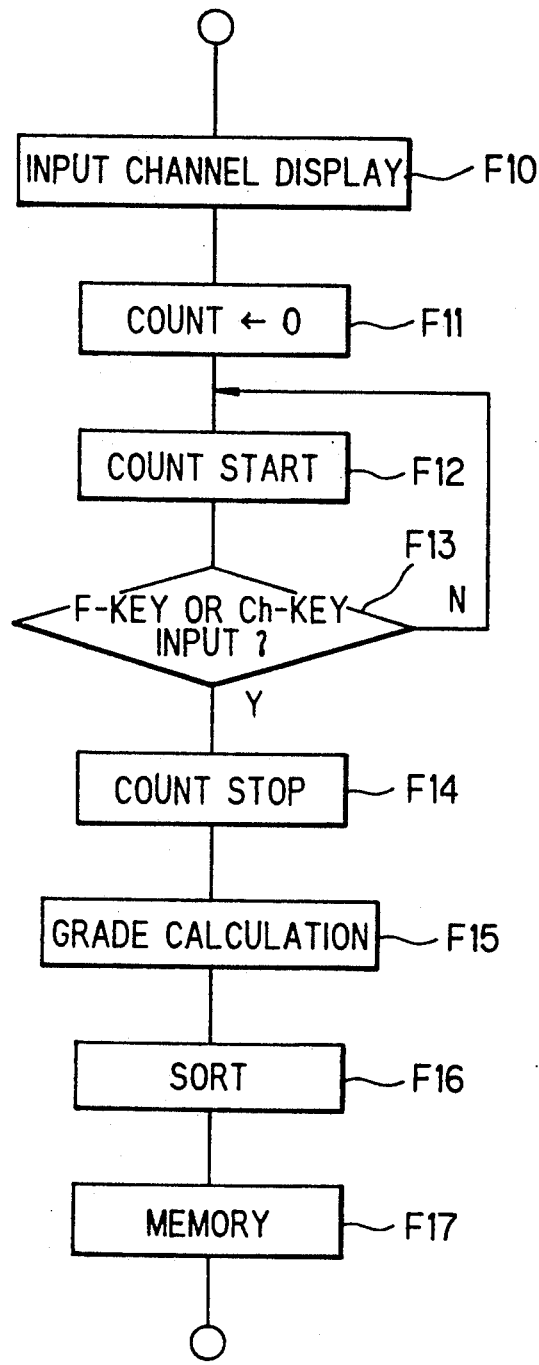
FIG. 3 is a flowchart for a memory process of tuning frequency in the embodiment of this invention.

FIG. 3 is a flowchart for a series of processings for storing a tuning frequency when a channel key is manipulated.

First, when a channel key (hereinafter referred to as "Ch key") is input (manipulated) during the actuation of the TV receiver, an input channel is displayed (F10), and a count time in the time counting circuit $9a$ is cleared (F11). Thereafter, the time counting operation is started to count a watching time for the input channel until the F key or another channel key (F12) is input. The time counting circuit $9a$ is cleared when powered on, and its counting operation is started.

If the input of the F key or Ch key is judged (F13), the time counting circuit $9a$ ceases its time counting operation (F14), and the grade circuit $9b$ calculates the grade of a channel just before the input of the F key or Ch key on the basis of the watching time serving as a parameter which is counted by the time counting circuit $9a$ (F15). The sort circuit $9b$ re-sorts the renewed grade of the channel in ascending order (F16).

The renewed ranking of the channel is stored in the memory circuit $9d$ every renewing operation (F17). About ten rankings may be stored in the memory, however, the rankings of all channels may be stored in the memory.

As described above, the steps of F10 to F17 of the flowchart as shown in FIG. 3 are repeated every manipulation of the F key or Ch key to thereby enable the renewing operation of the ranking stored in the memory circuit $9d$.

The operation flow of selecting a channel from the memory circuit $9d$ with the F key will be described with reference to a flowchart of FIG. 4.

First, upon input of the F key, it is judged whether a watching time counted by the FK counting circuit $9e$ exceeds a predetermined time x which is beforehand set (F21). If the count time is judged to exceed the time x, a first-ranking channel is selected (F23) to display the channel on a screen (F27), the FK counting circuit $9e$ is cleared (F28), and then the time counting operation is started again (F29). The FK time counting circuit $9e$ starts its time counting operation at the time when power is on.

If the watching time counted by the FK counting circuit $9e$ is judged not to exceed the predetermined time x (F21), when the currently-displayed channel ranks first, the first ranking channel is displayed with no alteration (F27), and the FK time counting circuit $9e$ is cleared (F28) to start the time counting operation again. Alternately, it may be adapted to display the second ranking channel when the currently-displayed channel ranks first.

If the watching time counted by the FK time counting circuit $9e$ does not exceed the predetermined time x (F21) and the currently-displayed channel is not the first ranking channel, the next ranking channel just below the currently-displayed channel is selected (F24). In a case where the number of the rankings of the channels which are stored in the memory circuit $9d$ are about ten rankings and the ranking of the currently-displayed channel is the tenth ranking channel which is the lowest ranking channel (F25), the ranking is returned to the first ranking (F26), then the channel of the first ranking is displayed on the screen (F27), and then the watching time counted by the FK time counting circuit $9e$ is cleared (F28) to start the time counting operation until the next F key input is carried out again (F29).

Figure 4:
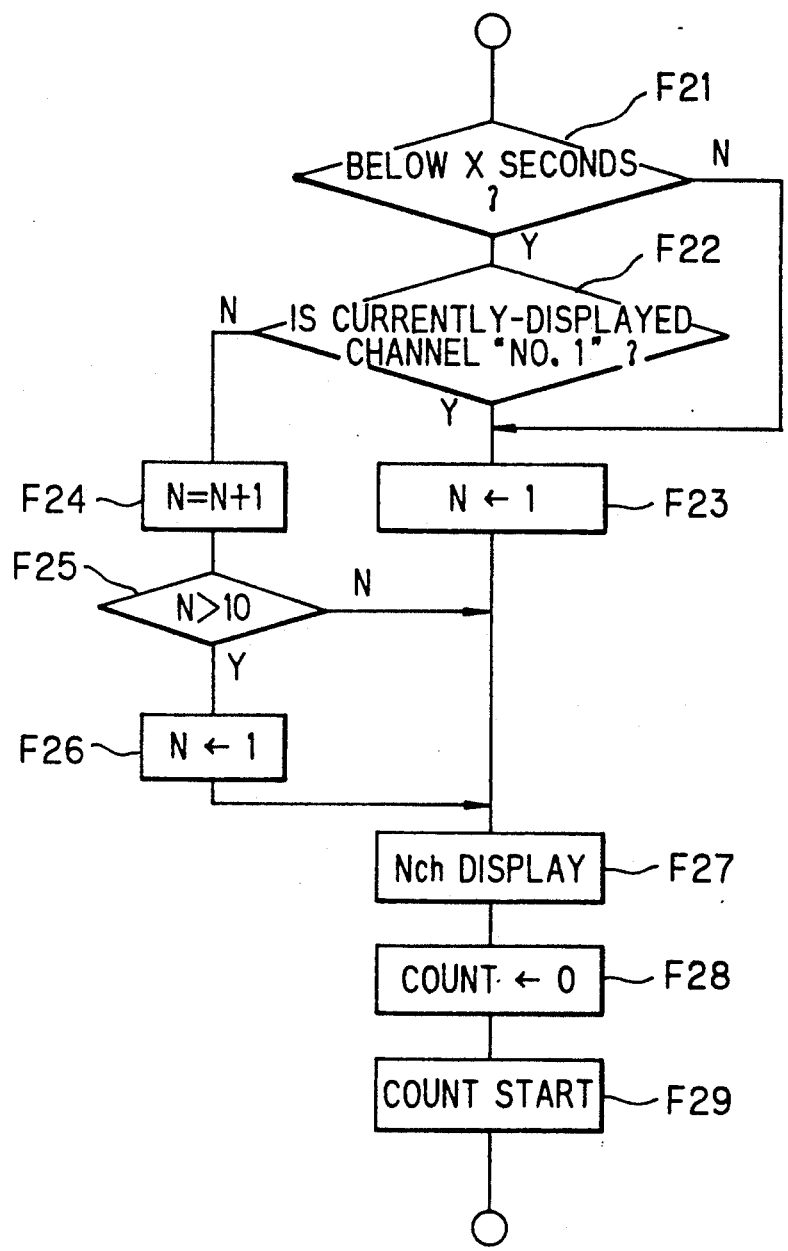
FIG. 4 is a flowchart for channel selection by the F key in the embodiment of this invention.

As described above, the operation of the flowchart as shown in FIG. 4 is repeated every manipulation of the F key, so that the broadcasting stations are successively selected in the order from a higher grade of tuning frequency to a lower grade of tuning frequency.

Accordingly, through the random input operation of a Ch key to select a channel, the grade of the tuning frequency of the channel is extracted, and the received channel is memorized while ranked. These memorized channels are successively selected by the input of the F key without a presetting operation by the viewer and without the viewer's paying attention to the number of stations to be memorized.

Figure 5:
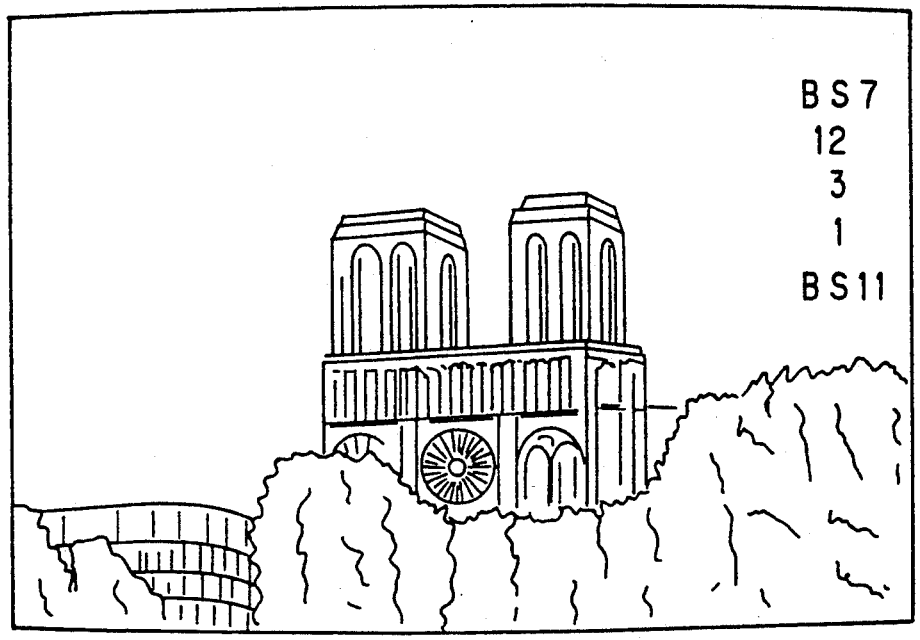
FIG. 5 is a schematic view of a screen on which channel rankings are displayed.

Since an F channel (Favorite-Ch) is randomly selected in accordance with its ranking, a list of the rankings may be displayed in a LIST mode in OSD10 as shown in FIG. 5 so that the viewer can check the F-channel state at a glance.

As described above, according to the TV receiver of this invention, in an ordinary use mode, a trend of a viewer's audience rating is checked in terms of his channel watching time, and his favorite watching (using) channel is stored in the tuning frequency arrangement storing means. In addition, the stored watching channels are successively selected in ranking order thereof by merely pushing the F key. Therefore, a cumbersome operation of beforehand storing viewer's favorite channels which has been conventionally required can be omitted. Further, the number of channels to be stored can be increased from the number of conventionally-adopted memory channel (about two three stations) to about 15 stations by increasing storage capacity of the memory circuit serving as the tuning frequency arrangement storing means, so that these stations can be successively selected through the F key by ranking many broadcast channels containing the BS broadcast and so on.

What is claimed is:

1. A TV receiver having a tuner and a controller for controlling a tuning operation of the tuner, wherein said controller includes a calculation unit for effecting a calculation if preferred station using as parameters a tuned channel and a time for which the channel is selected, and tuning frequency arrangement storing means for determining a channel which is frequently watched by a user on the basis of said calculation, and storing an indication of the channel in said tuning frequency arrangement storing means, the channel indication stored in said tuning frequency arrangement storing means being read out to perform said tuning operation when a preferred-station key provided in said TV receiver is pushed.

2. A TV receiver according to claim 1 wherein:
said calculation unit effects a calculation of a plurality of preferred stations;
said tuning frequency arrangement storing means determines a plurality of channels which are frequently watched and stores respective indications thereof; and
said indications are read out in ranked order in response to successive actuations of said preferred-station key.

* * * * *